(12) United States Patent
Kitabatake et al.

(10) Patent No.: US 12,247,280 B2
(45) Date of Patent: Mar. 11, 2025

(54) METAL FOIL WITH CARRIER

(71) Applicant: MITSUI MINING & SMELTING CO., LTD., Tokyo (JP)

(72) Inventors: Yukiko Kitabatake, Ageo (JP); Masahiro Koide, Ageo (JP); Rintaro Ishii, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 203 days.

(21) Appl. No.: 17/797,268

(22) PCT Filed: Jan. 21, 2021

(86) PCT No.: PCT/JP2021/002033
§ 371 (c)(1),
(2) Date: Aug. 3, 2022

(87) PCT Pub. No.: WO2021/157373
PCT Pub. Date: Aug. 12, 2021

(65) Prior Publication Data
US 2023/0072120 A1    Mar. 9, 2023

(30) Foreign Application Priority Data
Feb. 4, 2020    (JP) ................. 2020-016841

(51) Int. Cl.
*B32B 15/04*    (2006.01)
*C03C 17/36*    (2006.01)
(Continued)

(52) U.S. Cl.
CPC ...... *C23C 14/0005* (2013.01); *C03C 17/3615* (2013.01); *C03C 17/3618* (2013.01);
(Continued)

(58) Field of Classification Search
CPC ............ C03C 17/3615; C03C 17/3618; C03C 17/3626; C03C 17/3649; C03C 2218/155; C03C 2218/156; C03C 2218/322; C23C 14/0005; C23C 14/0036; C23C 14/024; C23C 14/0641; C23C 14/185;
(Continued)

(56) References Cited

U.S. PATENT DOCUMENTS

| | | |
|---|---|---|
| 2008/0081201 A1 | 4/2008 | Kato et al. |
| 2017/0349998 A1 | 12/2017 | Yoshinari et al. |
| 2021/0059057 A1 | 2/2021 | Ishii et al. |

FOREIGN PATENT DOCUMENTS

| | | |
|---|---|---|
| JP | 04-285033 A | 10/1992 |
| JP | H06-278244 A | 10/1994 |

(Continued)

*Primary Examiner* — Lawrence D Ferguson
(74) *Attorney, Agent, or Firm* — GREENBLUM & BERNSTEIN, P.L.C.

(57) ABSTRACT

Provided is a carrier-attached metal foil which can suppress the number of foreign matter particles on the surface of a metal layer to enhance circuit formability, and can keep stable releasability even after heating at a high temperature of 240° C. or higher (for example, 260° C.) for a long period of time. The carrier-attached metal foil includes a carrier, a release functional layer provided on the carrier, the release functional layer including a metal oxynitride, and a metal layer provided on the release functional layer.

10 Claims, 2 Drawing Sheets

(51) Int. Cl.
   *C23C 14/00*   (2006.01)
   *C23C 14/02*   (2006.01)
   *C23C 14/06*   (2006.01)
   *C23C 14/18*   (2006.01)
   *C23C 14/35*   (2006.01)
   *C23C 14/58*   (2006.01)
   *H05K 3/02*    (2006.01)

(52) U.S. Cl.
   CPC ...... *C03C 17/3626* (2013.01); *C03C 17/3649* (2013.01); *C23C 14/0036* (2013.01); *C23C 14/024* (2013.01); *C23C 14/0641* (2013.01); *C23C 14/185* (2013.01); *C23C 14/35* (2013.01); *C23C 14/5853* (2013.01); *H05K 3/025* (2013.01); *C03C 2218/155* (2013.01); *C03C 2218/156* (2013.01); *C03C 2218/322* (2013.01); *H05K 2203/0152* (2013.01); *H05K 2203/0156* (2013.01); *H05K 2203/016* (2013.01)

(58) Field of Classification Search
   CPC . C23C 14/35; C23C 14/5853; C23C 14/0605; C23C 14/0676; C23C 14/165; H05K 2203/0152; H05K 2203/0156; H05K 2203/016; H05K 3/025; H05K 1/09; H05K 2201/0355; H05K 3/4682; B32B 15/04; G06Q 10/08; G06Q 30/0259; H04L 9/085; H04L 9/3239; H04L 9/50
   See application file for complete search history.

(56) References Cited

FOREIGN PATENT DOCUMENTS

| | | |
|---|---|---|
| JP | 2003-332083 A | 11/2003 |
| JP | 2005-101137 A | 4/2005 |
| JP | 2006-297868 A | 11/2006 |
| JP | 2008-080712 A | 4/2008 |
| JP | 2008-198954 A | 8/2008 |
| JP | 2014-237270 A | 12/2014 |
| JP | 2017-088970 A | 5/2017 |
| JP | 2017-220150 A | 12/2017 |
| WO | 2016/136117 A1 | 9/2016 |
| WO | 2018/139945 A1 | 8/2018 |
| WO | 2018/164463 A1 | 9/2018 |
| WO | 2019/131000 A1 | 7/2019 |
| WO | 2019/187417 A1 | 10/2019 |

METAL FOIL WITH CARRIER

TECHNICAL FIELD

The present invention relates to a carrier-attached metal foil.

BACKGROUND ART

In recent years, multilayering of printed wiring boards has gradually prevailed to provide an increased mounting density of the printed wiring board to provide a decreased size thereof. Such multilayer printed wiring boards have been used for reductions in weight and size of many portable electronic devices. A further reduction in the thickness of an interlayer insulating layer and a further reduction in the weight of the wiring board are required for the multilayer printed wiring boards.

As a technique for meeting such requirements, a method for manufacturing a multilayer printed wiring board using a coreless build-up method has been employed. The coreless build-up method alternately laminates (builds up) insulating layers and wiring layers without using a so-called core substrate into a multilayer. In the coreless build-up method, it has been proposed to use a carrier-attached metal foil to facilitate release between a support and a multilayer printed wiring board. For example, Patent Literature 1 (JP2005-101137A) discloses a method for manufacturing a package substrate for mounting semiconductor devices, including bonding an insulating resin layer to the carrier surface of a carrier-attached copper foil to form a support, and forming a first wiring conductor on the superthin copper layer of the carrier-attached copper foil by a process such as photoresist processing, pattern electrodeposited copper plating, or resist removal, followed by stacking an insulating material and performing hot pressing or the like to form a build-up wiring layer, releasing a carrier-attached supporting substrate, and removing the superthin copper layer.

Since such a process for manufacturing a multilayer printed wiring board includes performing hot pressing after each stacking of the insulating material, the carrier-attached metal foil is heated at a high temperature for a long period of time. The heating temperature in the hot pressing depends on the curing temperature of the insulating material to be stacked, and thus differs depending on the type of the insulating material. In this regard, it is known that a higher heating temperature in the hot pressing leads to an excessive increase in release strength and loss in releasability.

A technique is proposed in which a release layer including a metal oxide and carbon is provided as a carrier-attached metal foil capable of complying with an increase in release strength due to heating. For example, Patent Literature 2 (WO2019/131000) discloses a carrier-attached copper foil including a carrier, an interlayer composed of a predetermined metal, a release layer including a metal oxide layer and a carbon layer, an etching stopper layer optionally provided, and a superthin copper layer in the listed order, and describes the predetermined release layer which is provided to thereby enable stable releasability to be kept even after heating at a high temperature of 350° C. or higher for a long period of time. The Literature also describes formation of the interlayer, the carbon layer, the superthin copper layer, and the like by sputtering in order to realize further reductions in thicknesses of the superthin copper layer and the like in the carrier-attached copper foil.

It is also known that a carrier-attached metal foil is stabilized in release strength by including a metal oxide layer. For example, Patent Literature 3 (JP2017-88970A) discloses a carrier-attached copper foil including a carrier, an interlayer containing nickel, and a superthin copper layer in this order, in which an oxidized layer ($NiO_2$) is formed on the surface of nickel by drying the interlayer in a condition of 30 to 100° C. for 1 to 300 seconds after formation of the interlayer and before formation of the superthin copper layer. According to Patent Literature 3, it is possible to favorably suppress the variation in release strength after bonding of the superthin copper layer of the carrier-attached copper foil onto an insulating substrate and pressure bonding at 220° C. for 2 hours.

CITATION LIST

Patent Literature

Patent Literature 1: JP2005-101137A
Patent Literature 2: WO2019/131000
Patent Literature 3: JP2017-88970A

SUMMARY OF INVENTION

The substrate is heated after each stacking of an interlayer insulating material in the process for manufacturing a multilayer printed wiring board, as described above, and therefore the carrier-attached metal foil is demanded to have heat resistance at a high temperature of, for example, 240° C. or higher. In this regard, the carrier-attached metal foil including an interlayer containing Ni and $NiO_2$, disclosed in Patent Literature 3 is stable in release strength at a low level at a hot pressing temperature of about 220° C. as described above; however, the foil does not comply with hot pressing at a higher temperature of, for example, 240° C. or higher.

Meanwhile, as disclosed in Patent Literature 2, using the carrier-attached metal foil including a release layer including a metal oxide layer and a carbon layer enables to keep stabilized releasability even after heating at a high temperature for a long period of time. However, it has been found that, when a carbon layer is formed as a release layer and a metal layer is formed thereon, foreign matter particles on the surface of the metal layer are increased as compared with no formation of any carbon layer (for example, formation of a metal layer directly on a glass carrier). The foreign matter particles are feared to influence circuit formation in a post-process. Therefore, there is a need for a carrier-attached metal foil which not only can keep heat resistance, but also can suppress the number of foreign matter particles.

The present inventors have now found that, by interposing a release functional layer containing a predetermined metal oxynitride between a carrier and a metal layer of a carrier-attached metal foil, it is possible to provide a carrier-attached metal foil which can suppress the number of foreign matter particles on the surface of the metal layer to enhance circuit formability, and can keep stable release strength even after heating at a high temperature of 240° C. or higher (for example, 260° C.) for a long period of time.

Therefore, an object of the present invention is to provide a carrier-attached metal foil which can suppress the number of foreign matter particles on the surface of a metal layer to enhance circuit formability, and can keep stable releasability even after heating at a high temperature of 240° C. or higher (for example, 260° C.) for a long period of time.

According to an aspect of the present invention, there is provided a carrier-attached metal foil comprising:

a carrier;
a release functional layer provided on the carrier, the release functional layer including a metal oxynitride; and
a metal layer provided on the release functional layer.

DESCRIPTION OF EMBODIMENT

Carrier-Attached Metal Foil

Figure 1:
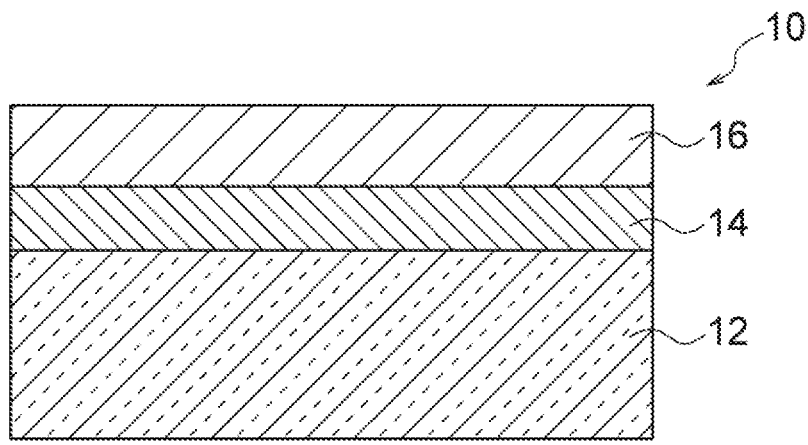
FIG. 1 is a schematic cross-sectional view showing an aspect of a carrier-attached metal foil of the present invention.
Figure 2:
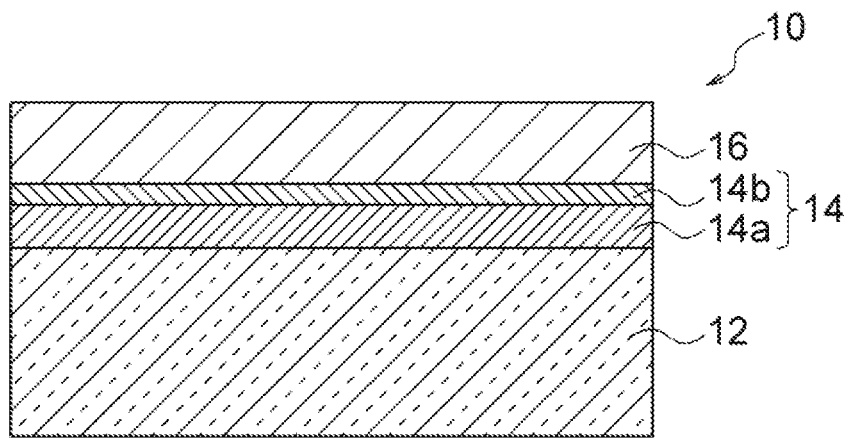
FIG. 2 is a schematic cross-sectional view showing another aspect of the carrier-attached metal foil of the present invention.

An example of a carrier-attached metal foil of the present invention is schematically shown in FIGS. 1 and 2. As shown in FIGS. 1 and 2, a carrier-attached metal foil 10 of the present invention includes a carrier 12, a release functional layer 14, and a metal layer 16 in this order. The release functional layer 14 is a layer which is provided on the carrier 12 and which contains metal oxynitride. The metal layer 16 is a layer provided on the release functional layer 14. The release functional layer 14 containing metal oxynitride is thus interposed between the carrier 12 and the metal layer 16 of the carrier-attached metal foil 10, whereby a carrier-attached metal foil can be provided which can suppress the number of foreign matter particles on the surface of the metal layer 16 to enhance circuit formability, and can keep stable release strength even after heating at a high temperature of 240° C. or higher (for example, 260° C.) for a long period of time.

Figure 3:
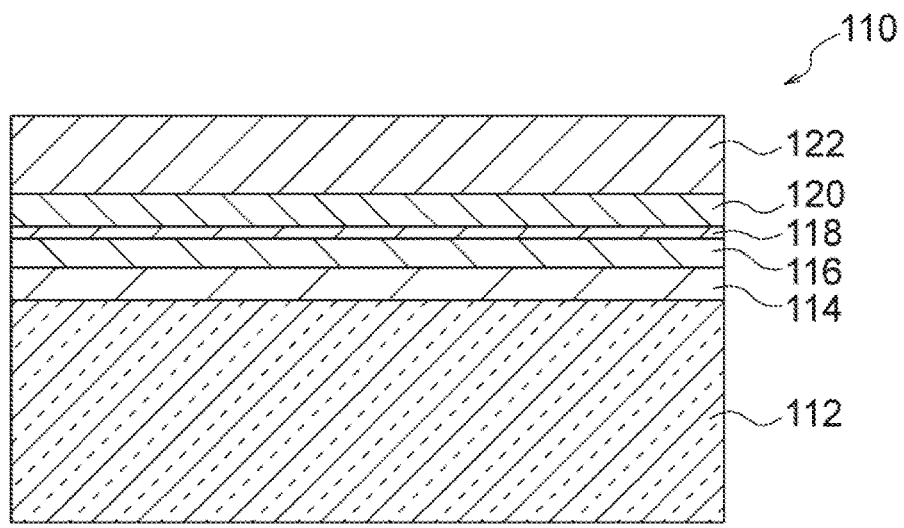
FIG. 3 is a schematic cross-sectional view showing a layer configuration of a carrier-attached metal foil of Example 11 (Comparison) in Examples.
Figure 4:
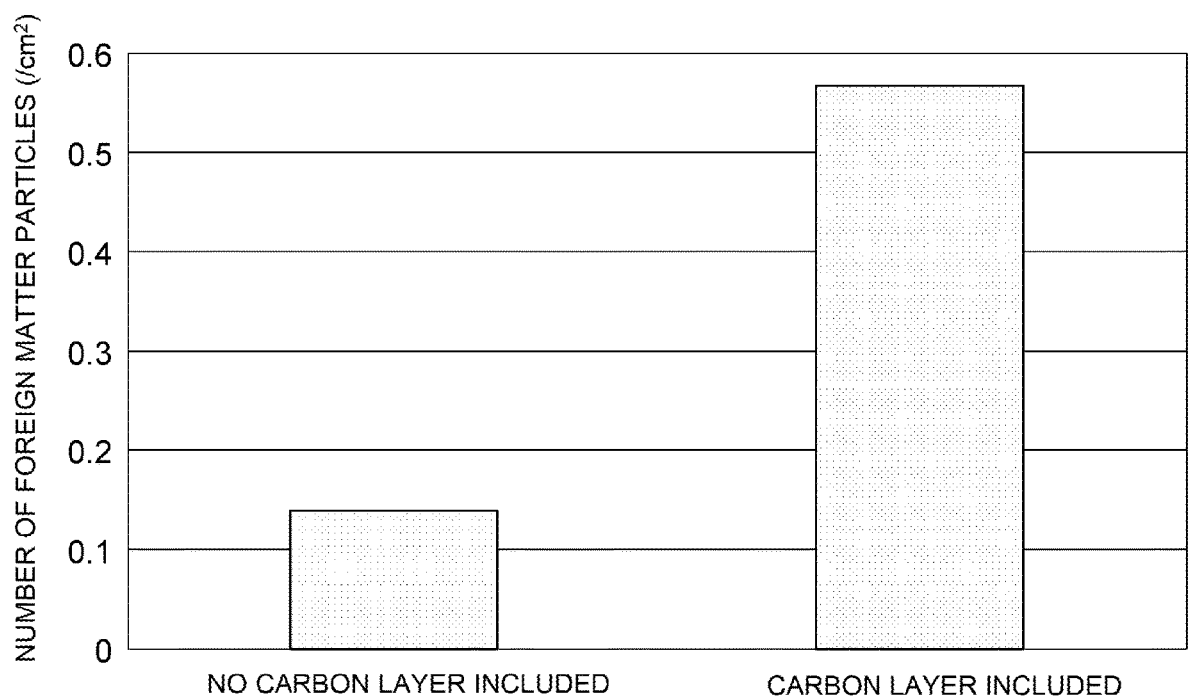
FIG. 4 is a view showing the change in the number of foreign matter particles on the surface of a metal layer depending on the presence or absence of a carbon layer.

As described above, the carrier-attached metal foil including an interlayer containing Ni and NiO$_2$ as disclosed in Patent Literature 3, though being stable in release strength at a low level at a hot pressing temperature of about 220° C., does not comply with hot pressing at a high temperature of 240° C. or higher. Meanwhile, as disclosed in Patent Literature 2, using the carrier-attached metal foil including a release layer including a metal oxide layer and a carbon layer enables to keep stable releasability even after heating at a high temperature for a long period of time. However, according to findings of the present inventors, a release layer includes a carbon layer and thus is feared to influence circuit formation in a post-process. That is, the present inventors investigated, and as a result, found that, when a carbon layer is formed as a release layer and a metal layer is formed thereon, the number of foreign matter particles on the surface of the metal layer is increased as compared with that when no carbon layer is formed. In one example, FIG. 3 shows a carrier-attached metal foil 110 including a carrier 112 composed of glass, an adhesion layer 114 composed of Ti, a release assistance layer 116 composed of Cu, a carbon layer 118 as a release layer, a second metal layer 120 composed of Ti, and a first metal layer 122 composed of Cu in this order. FIG. 4 shows the number per square centimeter of foreign matter particles (particle size 5 μm or more) present on the surface of the first metal layer 122 in each of the carrier-attached metal foil 110 and a carrier-attached metal foil 110' in which a first metal layer 122 composed of Cu is formed on a carrier 112 composed of glass. In FIG. 4, a left bar graph represents the number of foreign matter particles in the carrier-attached metal foil 110' having no carbon layer 118, and a right bar graph represents the number of foreign matter particles in the carrier-attached metal foil 110 having the carbon layer 118. As clear from FIG. 4, it is found that the number of foreign matter particles present on the surface of the first metal layer 122 of the carrier-attached metal foil 110 having the carbon layer 118 is triple or more than that of the carrier-attached metal foil 110' having no carbon layer 118. These foreign matter particles are feared to influence circuit formation in a post-process.

On the contrary, the carrier-attached metal foil 10 of the present invention includes the release functional layer 14 containing metal oxynitride, instead of the carbon layer. It is considered that the carrier-attached metal foil 10 can be thus effectively suppressed in increase in the number of foreign matter particles on the surface of the metal layer 16 and consequently circuit formation can be favorably performed in a post-process. Additionally, the carrier-attached metal foil 10 including the release functional layer 14 containing metal oxynitride can keep stable release strength even after heating at a high temperature of 240° C. or higher (for example, 260° C.) for a long period of time. That is, it is considered that the release functional layer 14 contains metal oxynitride to thereby enable an excessive increase in release strength according to heating to be suppressed. A specific index of the release strength is preferably 3 gf/cm or more and less than 50 gf/cm and more preferably 3 gf/cm or more and less than 30 gf/cm after pressing at 260° C. and a pressure of 30 kgf/cm$^2$ for 2 hours.

The material of the carrier 12 may be any one of glass, a ceramic, silicon, a resin, and a metal. Preferably, the carrier 12 is composed of glass, silicon, or a ceramic. The form of the carrier 12 may be any one of a sheet, a film, and a plate. The carrier 12 may be obtained by laminating sheets, films, plates and the like. For example, the carrier 12 may function as a rigid support such as a glass plate, a ceramic plate, a silicon wafer, or a metal plate, or may be a nonrigid support such as a metal foil or a resin film. Preferable examples of the metal constituting the carrier 12 include copper, titanium, nickel, stainless steel, and aluminum. Preferable examples of the ceramic include alumina, zirconia, silicon nitride, aluminum nitride, and other various fine ceramics. Preferable examples of the resin include polyethylene terephthalate (PET), polyethylene naphthalate (PEN), polyamide, polyimide, nylon, a liquid crystal polymer, polyether ether ketone (PEEK (registered trademark)), polyamideimide, polyether sulfone, polyphenylene sulfide, polytetrafluoroethylene (PTFE), and ethylene tetrafluoro ethylene (ETFE). From the viewpoint of preventing the warpage of a coreless support caused by heating when an electronic device is mounted, a material having a coefficient of thermal expansion (CTE) of less than 25 ppm/K (typically 1.0 ppm/K or more and 23 ppm/K or less) is more preferable. Examples of such a material include the above-described various resins (particularly low-thermal-expansion resins such as polyimide and a liquid crystal polymer), glass, silicon, and a ceramic. From the viewpoint of securing handleability and flatness during chip mounting, the carrier 12 preferably has Vickers hardness of 100 HV or more, and more preferably 150 HV or more and 2500 HV or less. In terms of the material satisfying these properties, the carrier 12 is preferably composed of glass, silicon, or a ceramic, more preferably glass or a ceramic, and particularly preferably glass. Examples of the carrier 12 composed of glass include a glass plate. The carrier 12 composed of glass has advantages such as lightweight, a low coefficient of thermal expansion, high insulating property, rigidity and a flat surface, so that the surface of the metal layer 16 can be made extremely smooth. Furthermore, when the carrier 12 is composed of glass, it advantageously has surface flatness (coplanarity) favorable for forming a minute circuit and resistance against chemicals in desmear in a wiring manufacturing process and various plating processes, and can employ a chemical detachement method when the carrier 12 is released from the carrier-attached metal foil 10. Preferable examples of the glass constituting the carrier 12 include quartz glass, borosilicate glass, non-alkali glass, soda-lime glass, aluminosilicate glass, and combinations thereof, more preferably non-alkali glass, soda-lime glass, and combinations thereof, and particularly preferably non-alkali glass. The non-alkali glass is substantially free of alkali metal and mainly contains silicon dioxide, aluminum oxide, boron oxide, an alkaline earth metal oxide such as calcium oxide or barium oxide, and further contains boric acid. The non-alkali glass has a low stable coefficient of thermal expansion of 3 ppm/K or more and 5 ppm/K or less in a wide temperature range from 0° C. to 350° C., so that the warpage of the glass in the heating process can be advantageously minimized. The thickness of the carrier 12 is preferably 100 μm or more and 2000 μm or less, more preferably 300 μm or more and 1800 μm or less, and still more preferably 400 μm or more and 1100 μm or less. The carrier having a thickness within such a range can achieve thinning of the wiring and a reduction in warpage during the mounting of electronic parts, while ensuring suitable strength which does not interfere with handling.

The surface of the carrier 12 disposed adjacent to the release functional layer 14 preferably has an arithmetic average roughness Ra of 0.1 nm or more and 70 nm or less, more preferably 0.5 nm or more and 60 nm or less, still more preferably 1.0 nm or more and 50 nm or less, particularly preferably 1.5 nm or more and 40 nm or less, and most preferably 2.0 nm or more and 30 nm or less, as measured in accordance with JIS B 0601-2001 using a laser microscope. Thus, as the arithmetic average roughness of the surface of the carrier 12 is smaller, a desirably lower arithmetic average roughness Ra can be provided in the surface of the metal layer 16 on the opposite side of the release functional layer 14 (the outer surface of the metal layer 16). Thereby, in a wiring formed using the metal layer 16, the carrier 12 is suitable for forming a wiring pattern having very fine line/space (L/S) of 13 μm or less/13 μm or less (for example, 12 μm/12 μm to 2 μm/2 μm).

The release functional layer 14 is a layer interposed between the carrier 12 and the metal layer 16, and contributing to the stable release of the carrier 12. From the viewpoint that stable release strength is kept even after heating at a high temperature of 240° C. or higher (for example, 260° C.) for a long period of time, the release functional layer 14 is a layer containing metal oxynitride, and preferably contains at least one metal oxynitride selected from the group consisting of TaON, NiON, TiON, NiWON, and MoON, more preferably contains at least one selected from the group consisting of TaON, NiON, TiON, and MoON, still more preferably contains at least one selected from the group consisting of TaON, NiON, and TiON, and particularly preferably contains at least one selected from the group consisting of TaON and TiON. From the viewpoint that adhesion between the carrier 12 and the metal layer 16 are secured, a surface of the release functional layer 14, the surface facing the carrier 12, preferably contains at least one selected from the group consisting of Cu, Ti, Ta, Cr, Ni, Al, Mo, Zn, W, TiN, and TaN, more preferably contains at least one selected from the group consisting of Ti, Ta, Cr, Ni, Al, Mo, Zn, W, TiN, and TaN, still more preferably contains at least one selected from the group consisting of Ti, Ni, Al, Mo, W, TiN, and TaN, and particularly preferably contains at least one selected from the group consisting of Ti, Al, and TaN. The content of the metal or metal nitride in the surface of the release functional layer 14, the surface facing the carrier 12, is 30 atom % or more, preferably 40 atom % or more, more preferably 50 atom % or more, still more preferably 60 atom % or more, particularly preferably 70 atom % or more, and most preferably 80 atom % or more. The upper limit of the content of the metal or metal nitride is not particularly limited and may be 100 atom %, but it is typically 98 atom % or less. The metal or metal nitride is compatible with the material of the carrier 12, and can allow the adhesion to be secured. The content is preferably controlled in the above range because the adhesion can be stably secured even after heating at a high temperature for a long period of time. The content is a value measured by analysis with X-ray photoelectron spectroscopy (XPS).

On the other hand, from the same viewpoint as described above, the surface of the release functional layer 14 on the opposite side of the carrier 12 (that is, on the metal layer 16) preferably contains at least one metal oxynitride selected from the group consisting of TaON, NiON, TiON, NiWON, and MoON, more preferably contains at least one selected from the group consisting of TaON, NiON, TiON, and MoON, still more preferably contains at least one selected from the group consisting of TaON, NiON, and TiON, and particularly preferably contains at least one selected from the group consisting of TaON and TiON. In the present invention, the metal oxynitride may contain 0 and N at respective any proportions relative to a metal component constituting the metal oxynitride (for example, Ta when the metal oxynitride is TaON). In other words, the metal oxynitride in the present invention can be represented by a basis composition of general formula: $MO_xN_y$ (wherein M is a metal component such as Ta, Ni, Ti, NiW, or Mo, and x and y are each independently a real number of more than 0). In the surface of the release functional layer 14 on the opposite side of the carrier 12, the atomic ratio of O relative to the metal component constituting the metal oxynitride is preferably 4% or more (more preferably 5% or more and 120% or less) and the atomic ratio of N relative to the metal component constituting the metal oxynitride is preferably 20% or more (more preferably 25% or more and 45% or less). In the surface of the release functional layer 14 on the opposite side of the carrier 12, the content of the metal component constituting the metal oxynitride is preferably 20 atom % or more and 80 atom % or less, more preferably 25 atom % or more and 75 atom % or less, still more preferably 30 atom % or more and 70 atom % or less, and particularly preferably 35 atom % or more and 68 atom % or less.

The release functional layer 14 preferably does not include any carbon layer (that is, layer mainly composed of carbon) from the viewpoint that the number of foreign matter particles on the surface of the metal layer 16 can be effectively suppressed. Herein, the release functional layer 14 may contain inevitable impurities derived from raw material components and deposition processes and the like. When the release functional layer 14 is exposed to the atmosphere after the deposition of the release functional layer 14, the presence of carbon dioxide and the like inevitably incorporated from the exposure is tolerated without particular limitation. From the above viewpoint, in the release functional layer 14, the content of carbon measured by XPS may be equal to or less than the lower detection limit, but it is typically 3 atom % or less and more typically 1 atom % or less. The content of carbon measured on the outermost surface (depth 0 nm) with XPS tends to be higher due to contamination or the like during exposure to the atmosphere, and thus the content of carbon in the release functional layer 14 is a value at a position of a depth of 2 nm (in terms of $SiO_2$ sputtering rate) from the surface (that is, the surface of the release functional layer 14 on the opposite side of the carrier 12). The release functional layer 14 may be manufactured by any method, but it is particularly preferably formed by a magnetron sputtering method using a target in terms of improved uniformity of film thickness distribution.

The thickness of the release functional layer 14 is preferably 5 nm or more and 500 nm or less, more preferably 10 nm or more and 400 nm or less, still more preferably 20 nm or more and 200 nm or less, and particularly preferably 30 nm or more and 100 nm or less.

The thickness is a value measured by analyzing the cross section of the layer with transmission electron microscopy-energy dispersive X-ray spectroscopy (TEM-EDX).

The release functional layer 14 may be configured from one layer as shown in FIG. 1, or may be configured from two or more layers as shown in FIG. 2.

According to a preferable aspect of the present invention, the release functional layer 14 includes an adhesion layer 14a and a release layer 14b as shown in FIG. 2.

The adhesion layer 14a has a function of relatively enhancing adhesion between the carrier 12 and the release functional layer 14 and thus allowing stable release from the interface between the release functional layer 14 and the metal layer 16 to occur. The adhesion layer 14a is preferably a layer containing at least one selected from the group consisting of Cu, Ti, Ta, Cr, Ni, Al, Mo, Zn, W, TiN, and TaN, more preferably a layer containing at least one selected from the group consisting of Ti, Ta, Cr, Ni, Al, Mo, Zn, W, TiN, and TaN, still more preferably a layer containing at least one selected from the group consisting of Ti, Ni, Al, Mo, W, TiN, and TaN, and particularly preferably a layer containing at least one selected from the group consisting of Ti, Al, and TaN. In the adhesion layer 14a, the content of the metal or metal nitride measured by X-ray photoelectron spectroscopy (XPS) is preferably 30 atom % or more, more preferably 40 atom % or more, still more preferably 50 atom % or more, further more preferably 60 atom % or more, particularly preferably 70 atom % or more, and most preferably 80 atom % or more. The upper limit of the content of the metal or metal nitride in the adhesion layer 14a is not particularly limited and may be 100 atom %, but it is realistically 98 atom % or less. When the adhesion layer 14a is exposed to the atmosphere after the deposition of the adhesion layer 14a, the presence of oxygen incorporated from the exposure is tolerated without particular limitation. In the adhesion layer 14a, the content of the oxygen measured by X-ray photoelectron spectroscopy (XPS) is typically 0.1 atom % or more and 10 atom % or less, more typically 0.3 atom % or more and 7 atom % or less, and still more typically 0.5 atom % or more and 5 atom % or less. The adhesion layer 14a may be manufactured by any method, but it is particularly preferably formed by a magnetron sputtering method using a target in terms of improved uniformity of film thickness distribution. The thickness $T_1$ of the adhesion layer 14a is preferably 5 nm or more and 400 nm or less, more preferably 10 nm or more and 300 nm or less, still more preferably 50 nm or more and 200 nm or less, and particularly preferably 50 nm or more and 100 nm or less. The thickness is a value measured by analyzing the cross section of the layer with transmission electron microscopy-energy dispersive X-ray spectroscopy (TEM-EDX).

The release layer 14b is preferably a layer which is provided on the adhesion layer 14a and which contains at least one metal oxynitride selected from the group consisting of TaON, NiON, TiON, NiWON, and MoON, and is more preferably a layer containing at least one selected from the group consisting of TaON, NiON, TiON, and MoON, still more preferably at least one selected from the group consisting of TaON, NiON, and TiON, and particularly preferably at least one selected from the group consisting of TaON and TiON. In the release layer 14b, the atomic ratio of O relative to the metal component constituting the metal oxynitride is preferably 4% or more (more preferably 5% or more and 120% or less) and the atomic ratio of N relative to the metal component constituting the metal oxynitride is preferably 20% or more (more preferably 25% or more and 45% or less), as measured by X-ray photoelectron spectroscopy (XPS). In the release layer 14b, the content of the metal component constituting the metal oxynitride, as measured by X-ray photoelectron spectroscopy (XPS), is preferably 20 atom % or more and 80 atom % or less, more preferably 25 atom % or more and 75 atom % or less, still more preferably 30 atom % or more and 70 atom % or less, and particularly preferably 35 atom % or more and 68 atom % or less. The release layer 14b may contain inevitable impurities derived from raw material components and deposition processes and the like. The release layer 14b may be manufactured by any method, but it is preferably a layer formed by a reactive sputtering method using a metal target or a metal nitride target, the method including performing sputtering under an atmosphere containing oxygen and/or nitrogen, from the viewpoint that the film thickness can be easily controlled by adjustment of the deposition time. The release layer 14b may also be formed by treating the surface of the adhesion layer 14a in oxygen plasma and/or nitrogen plasma with a commercially available plasma ashing apparatus. When the adhesion layer 14a contains metal nitride (that is, TiN and/or TaN), the release layer 14b can also be produced by exposing the adhesion layer 14a formed in vacuum, to an oxidizing atmosphere (for example, the atmosphere).

The thickness $T_2$ of the release layer 14b is preferably 1 nm or more and 150 nm or less, more preferably 3 nm or more and 130 nm or less, still more preferably 10 nm or more and 120 nm or less, and particularly preferably 50 nm or more and 100 nm or less. The release layer 14b can be formed so as to be thicker than a conventional release layer composed of carbon (carbon layer). In this regard, the thickness $T_2$ of the release layer 14b is larger (for example, $T_2$ is 50 nm or more), whereby the release layer 14b can also function as an etching stopper layer. That is, the metal oxynitride constituting the release layer 14b is less likely dissolved in a flash etching solution (for example, Cu flash etching solution). As a result, the release layer 14b can exhibit excellent chemical resistance to the flash etching solution. Therefore, the release layer 14b is a layer less likely etched with the flash etching solution as compared with the metal layer 16 to be described later, and therefore, can function as an etching stopper layer.

The thickness $T_2$ of the release layer 14b can be specified by depth direction elemental analysis of the carrier-attached metal foil 10 with X-ray photoelectron spectroscopy (XPS)

according to various conditions described in Examples below. It is herein difficult in the depth direction elemental analysis with XPS to obtain the numerical value of the thickness $T_2$ by itself of the release layer 14$b$, because the etching rate differs depending on the type of a material even in use of the same etching conditions. Thus, the thickness $T_2$ here adopted is a thickness in terms of $SiO_2$, in which the thickness is calculated from the time taken for etching by use of the etching rate calculated based on a $SiO_2$ film having a known film thickness. Thus, the thickness can be unambiguously determined and therefore can be quantitatively evaluated.

In the carrier-attached metal foil 10, a ratio $T_1/T_2$ of the thickness $T_1$ of the adhesion layer 14$a$ to the thickness $T_2$ of the release layer 14$b$ is preferably 0.03 or more and 400 or less, more preferably 0.07 or more and 300 or less, still more preferably 0.1 or more and 200 or less, and particularly preferably 0.38 or more and 100 or less. $T_1/T_2$ is set to be within the above range, whereby deterioration in the release function of the release functional layer 14 can be suppressed even when a heat treatment is performed in a wide temperature region including a high temperature range of 100° C. or higher and 260° C. or lower, for example. A mechanism in which the ratio of the thicknesses of the adhesion layer 14$a$ and the release layer 14$b$ influences releasability is not necessarily clear, but this is considered to be because the diffusion behaviors of the elements constituting the layers of the carrier-attached metal foil 10 during heating are changed by changing the above ratio of the thicknesses.

The metal layer 16 is a layer composed of a metal. The metal layer 16 is preferably composed of at least one metal or alloy selected from the group consisting of Group 4, Group 5, Group 6, Group 9, Group 10, and Group 11 transition elements and Al, and is more preferably composed of at least one metal or alloy selected from the group consisting of Group 4 and Group 11 transition elements, and Pt, Al, Nb, Co, Ni, and Mo, still more preferably at least one metal or alloy selected from the group consisting of Group 11 transition elements, and Pt, Ti, Al, and Mo, further more preferably at least one metal or alloy selected from the group consisting of Cu, Au, Pt, Ti, and Mo, particularly preferably at least one metal or alloy selected from the group consisting of Cu, Au, and Pt, and most preferably Cu. The above metal constituting the metal layer 16 may be a pure metal or an alloy. In the metal layer 16, the content of the above metal measured by X-ray photoelectron spectroscopy (XPS) is preferably 60 atom % or more, more preferably 70 atom % or more, still more preferably 80 atom % or more, and particularly preferably 90 atom % or more. The upper limit of the content of the above metal in the metal layer 16 is not particularly limited. The upper limit may be 100 atom %, but it is typically 98 atom % or less. The metal constituting the metal layer 16 may contain inevitable impurities derived from raw material components and deposition processes and the like. The metal layer 16 is preferably a layer formed by a vapor-phase method such as sputtering. The metal layer 16 is preferably a metal layer not roughened, but it may be secondarily roughened by preliminary roughening, a soft etching treatment, a rinsing treatment, or an oxidation-reduction treatment as long as there is no interference with wiring pattern formation during manufacturing of a printed wiring board. The thickness $T_3$ of the metal layer 16 is preferably 10 nm or more and 1000 nm or less, more preferably 20 nm or more and 900 nm or less, still more preferably 30 nm or more and 700 nm or less, particularly preferably 50 nm or more and 600 nm or less, particularly more preferably 70 nm or more and 500 nm or less, and most preferably 100 nm or more and 400 nm or less. The thickness is a value measured by analyzing the cross section of the layer with transmission electron microscopy-energy dispersive X-ray spectroscopy (TEM-EDX). The metal layer 16 having a thickness in such a range is preferably manufactured by a sputtering method from the viewpoints of in-plane uniformity of the thickness of a film deposited and productivity of a sheet or a roll.

The surface of the metal layer 16 on the opposite side of the release functional layer 14 (the outer surface of the metal layer 16) preferably has an arithmetic average roughness Ra of 1.0 nm or more and 100 nm or less, more preferably 2.0 nm or more and 40 nm or less, still more preferably 3.0 nm or more and 35 nm or less, particularly preferably 4.0 nm or more and 30 nm or less, and most preferably 5.0 nm or more and 15 nm or less, as measured in accordance with JIS B 0601-2001. The arithmetic average roughness, as is thus lower, is more suitable for formation of a wiring pattern highly fined to such an extent that the line/space (US) of a printed wiring board manufactured using the carrier-attached metal foil 10 is 13 μm or less/13 μm or less (for example, from 12 μm/12 μm to 2 μm/2 μm).

The metal layer 16 may be configured from one layer or may be configured from two or more layers. The carrier-attached metal foil 10 may include other layer as long as the carrier-attached metal foil 10 includes the carrier 12, the release functional layer 14, and the metal layer 16 in this order and original functions thereof are not impaired. Examples of such other layer include an etching stopper layer disclosed in Patent Literature 2 (WO2019/131000), and a barrier layer (for example, a layer composed of Ti, Ta, Ni, W, Cr, Pd, or a combination thereof) for suppressing the formation of an intermetallic compound of the metal (for example, Au or Pt) constituting the metal layer 16 and the metal (for example, Cu) constituting a wiring layer which may be formed on the metal layer 16 (that is, the surface of the carrier-attached metal foil 10 on the opposite side of the carrier 12). In the carrier-attached metal foil 10, the above-described various layers may be symmetrically provided in order in a vertical direction on both the surfaces of the carrier 12.

The entire thickness of the carrier-attached metal foil 10 is not particularly limited, but it is preferably 500 μm or more and 3000 μm or less, more preferably 700 μm or more and 2500 μm or less, still more preferably 900 μm or more and 2000 μm or less, and particularly preferably 1000 μm or more and 1700 μm or less. The shape and size of the carrier-attached metal foil 10 are not particularly limited, but the carrier-attached metal foil 10 preferably has a rectangular or square shape having a size of 10 cm or more, more preferably 20 cm or more, and still more preferably 25 cm or more on a side. When the carrier-attached metal foil 10 has a rectangular or square shape, the upper limit of the size is not particularly limited, but it is, for example, 1000 cm on a side, as one indication of the upper limit. The carrier-attached metal foil 10 can be independently handled by itself before and after the formation of the wiring.

Method for Manufacturing Carrier-Attached Metal Foil

The carrier-attached metal foil 10 of the present invention can be manufactured by providing the above carrier 12, and forming a release functional layer 14 (for example, an adhesion layer 14$a$ and a release layer 14$b$) and a metal layer 16 on the carrier 12. Each of the release functional layer 14 and the metal layer 16 is preferably formed by a physical vapor deposition (PVD) method from the viewpoint of easily complying with fine pitch due to superthinning. Examples of the physical vapor deposition (PVD) method include a sputtering method, a vacuum deposition method, and an ion plating method. In terms of being capable of controlling the film thickness over a wide range of 0.05 nm to 5,000 nm and maintaining the uniform film thickness over a wide width or wide area, the sputtering method is most preferable. The deposition due to the physical vapor deposition (PVD) method may be performed under known conditions with any known vapor-phase deposition apparatus, and is not particularly limited. For example, when the sputtering method is employed, a sputtering system may be various known methods such as magnetron sputtering, a bipolar sputtering method, and a counter target sputtering method, but in terms of a high deposition rate and high productivity, the magnetron sputtering is preferable. The sputtering may be performed with any of direct current (DC) and high frequency (RF) power supplies. Regarding the target shape, a well-known plate target can be used, but from the viewpoint of the efficiency of use of the target, it is desirable to use a cylindrical target. Hereinafter, the deposition due to the physical vapor deposition (PVD) method (preferably the sputtering method) of each of the adhesion layer 14a, the release layer 14b, and the metal layer 16 will be described.

The deposition of the adhesion layer 14a due to the physical vapor deposition (PVD) method (preferably the sputtering method) is preferably performed by magnetron sputtering under a non-oxidizing atmosphere using a target composed of at least one metal or metal nitride selected from the group consisting of Cu, Ti, Ta, Cr, Ni, Al, Mo, Zn, W, TiN, and TaN in terms of being capable of improving uniformity in film thickness distribution. The purity of the target is preferably 99.9% by weight or more. As the gas used for sputtering, an inert gas such as an argon gas is preferably used. The flow rate of the argon gas or the like may be appropriately determined depending on a sputtering chamber size and deposition conditions, and is not particularly limited. From the viewpoint of continuous deposition without operation failures such as abnormal discharge and plasma irradiation failure, the pressure during deposition is preferably within the range of 0.1 Pa or more and 20 Pa or less. The pressure range may be set by adjusting the electric power for deposition and the flow rate of the argon gas or the like depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 10.0 W/cm$^2$ or less per unit area of the target.

The deposition of the release layer 14b due to the physical vapor deposition (PVD) method (preferably the sputtering method) is preferably performed by a reactive sputtering method under an atmosphere containing oxygen and/or nitrogen using a target composed of at least one metal or metal nitride selected from the group consisting of Ta, Ni, Ti, NiW, Mo, TiN, and TaN, from the viewpoint that the film thickness can be easily controlled. The purity of the target is preferably 99.9% or more. The gas used for sputtering preferably contains not only an inert gas (for example, argon gas), but also gases (for example, an oxygen gas, a nitrogen monoxide gas, and a nitrogen dioxide gas) for generating the metal oxynitride. The flow rates of these gases may be appropriately determined depending on a sputtering chamber size and deposition conditions, and are not particularly limited. From the viewpoint of continuous deposition without operation failures such as abnormal discharge, the pressure during deposition is preferably within the range of 0.1 Pa or more and 1.0 Pa or less. The pressure range may be controlled by adjusting the electric power for deposition and the flow rates of the gases depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 15.0 W/cm$^2$ or less per unit area of the target.

The deposition of the metal layer 16 due to the physical vapor deposition (PVD) method (preferably the sputtering method) is preferably performed under an inert atmosphere of argon or the like using a target composed of at least one metal selected from the group consisting of Group 4, Group 5, Group 6, Group 9, Group 10, and Group 11 transition elements, and Al. The target is preferably composed of a pure metal or an alloy, but it may contain inevitable impurities. The purity of the target is preferably 99.9% or more, more preferably 99.99% or more, and still more preferably 99.999% or more. A cooling mechanism for the stage may be provided during sputtering to avoid a temperature rise during the vapor-phase deposition of the metal layer 16. From the viewpoint of stable deposition without operation failures such as abnormal discharge and plasma irradiation failure, the pressure during deposition is preferably within the range of 0.1 Pa or more and 20 Pa or less. The pressure range may be set by adjusting the electric power for deposition and the flow rate of the argon gas depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 10.0 W/cm$^2$ or less per unit area of the target.

EXAMPLES

The present invention will be more specifically described by the following Examples.

Example 1

As shown in FIG. 2, on a glass sheet as a carrier 12, a release functional layer 14 (adhesion layer 14a and release layer 14b) and a metal layer 16 were deposited in this order, to manufacture a carrier-attached metal foil 10. Specific procedures will be described below.

(1) Preparation of Carrier

A glass sheet having a thickness of 1.1 mm (material: soda-lime glass, arithmetic average roughness Ra: 0.6 nm) was prepared.

(2) Formation of Adhesion Layer

On the carrier 12, a TaN layer having a thickness of 100 nm was formed as the adhesion layer 14a by a sputtering method. The sputtering was performed under the following conditions using the following apparatus.

Apparatus: single wafer type magnetron sputtering apparatus (MLS 464, manufactured by Canon Tokki Corporation)
Target: TaN target (purity: 99.95% or more) having a diameter of 8 inches (203.2 mm)
Ultimate vacuum: less than $1 \times 10^{-4}$ Pa
Gas: argon gas (flow rate: 100 sccm)
Sputtering pressure: 0.35 Pa Sputtering power: 1000 W (3.1 W/cm$^2$)
Temperature during deposition: 40° C.

(3) Formation of Release Layer

A sample where the adhesion layer 14a was formed was taken out from the vacuum and exposed to the atmosphere for 5 minutes, whereby a surface oxidization treatment (natural oxidization) of the adhesion layer 14a was performed. A TaON layer was formed as the release layer 14b by the surface oxidization treatment.

(4) Formation of Metal Layer

A Cu layer having a thickness of 300 nm was formed as the metal layer 16 on the release layer 14b by sputtering with the following apparatus and conditions, to obtain a carrier-attached metal foil 10.

Apparatus: single wafer type DC sputtering apparatus (MLS 464, manufactured by Canon Tokki Corporation)
    Target: Cu target (purity: 99.98%) having a diameter of 8 inches (203.2 mm)
    Ultimate vacuum: less than 1×10$^{-4}$ Pa
    Gas: argon gas (flow rate: 100 sccm)
    Sputtering pressure: 0.35 Pa
    Sputtering power: 1000 W (3.1 W/cm$^2$)
    Temperature during deposition: 40° C.

Example 2

A carrier-attached metal foil 10 was produced in the same manner as in Example 1 except that a TiON layer was formed as the release layer 14b by reactive sputtering as follows, instead of the surface oxidization treatment of the adhesion layer 14a due to exposure to the atmosphere.

(Formation of TiON Layer)

A TiON layer where an objective thickness was about 100 nm was formed on the surface of the adhesion layer 14a by reactive sputtering with the following apparatus and conditions.

Apparatus: single wafer type DC sputtering apparatus (MLS 464, manufactured by Canon Tokki Corporation)
    Target: TiN target (purity: 99.95% or more) having a diameter of 8 inches (203.2 mm)
    Ultimate vacuum: less than 1×10$^{-4}$ Pa
    Gases: argon gas (flow rate: 90 sccm) and oxygen gas (flow rate: 10 sccm)
    Sputtering pressure: 0.35 Pa
    Sputtering power: 100 W (0.3 W/cm$^2$)
    Temperature during deposition: 40° C.

Example 3

A carrier-attached metal foil 10 was produced in the same manner as in Example 1 except that (i) a Ti layer was formed as the adhesion layer 14a, instead of the TaN layer, and (ii) a TaON layer was formed by reactive sputtering as follows, instead of the surface oxidization treatment of the adhesion layer 14a due to exposure to the atmosphere.

(Formation of Ti Layer)

On the carrier 12, a Ti layer having a thickness of 100 nm was formed as the adhesion layer 14a by a sputtering method. The sputtering was performed under the following conditions using the following apparatus.

Apparatus: single wafer type magnetron sputtering apparatus (MLS 464, manufactured by Canon Tokki Corporation)
    Target: Ti target (purity: 99.999%) having a diameter of 8 inches (203.2 mm)
    Ultimate vacuum: less than 1×10$^{-4}$ Pa
    Gas: argon gas (flow rate: 100 sccm)
    Sputtering pressure: 0.35 Pa
    Sputtering power: 1000 W (3.1 W/cm$^2$)
    Temperature during deposition: 40° C.

(Formation of TaON Layer)

A TaON layer where an objective thickness was about 100 nm was formed on the surface of the adhesion layer 14a by reactive sputtering with the following apparatus and conditions.

Apparatus: single wafer type DC sputtering apparatus (MLS 464, manufactured by Canon Tokki Corporation)
    Target: TaN target (purity: 99.98%) having a diameter of 8 inches (203.2 mm)
    Ultimate vacuum: less than 1×10$^{-4}$ Pa
    Gas: argon gas (flow rate: 90 sccm) and oxygen gas (flow rate: 10 sccm)
    Sputtering pressure: 0.35 Pa
    Sputtering power: 100 W (0.3 W/cm$^2$)
    Temperature during deposition: 40° C.

Example 4

A carrier-attached metal foil 10 was produced in the same manner as in Example 2 except that a Ti layer having a thickness of 100 nm was formed as the adhesion layer 14a, instead of the TaN layer, with the same apparatus and conditions as in Example 3.

Example 5

A carrier-attached metal foil 10 was produced in the same manner as in Example 3 except that an Al layer was formed as the adhesion layer 14a, instead of the Ti layer.

(Formation of Al Layer)

On the carrier 12, an Al layer having a thickness of 100 nm was formed as the adhesion layer 14a by a sputtering method. The sputtering was performed under the following conditions using the following apparatus.

Apparatus: single wafer type magnetron sputtering apparatus (MLS 464, manufactured by Canon Tokki Corporation)
    Target: Al target (purity: 99.95% or more) having a diameter of 8 inches (203.2 mm)
    Ultimate vacuum: less than 1×10$^{-4}$ Pa
    Gas: argon gas (flow rate: 100 sccm)
    Sputtering pressure: 0.35 Pa
    Sputtering power: 1000 W (3.1 W/cm$^2$)
    Temperature during deposition: 40° C.

Example 6

A carrier-attached metal foil 10 was produced in the same manner as in Example 2 except that an Al layer having a thickness of 100 nm was formed as the adhesion layer 14a, instead of the TaN layer, with the same apparatus and conditions as in Example 5.

Example 7 (Comparison)

A carrier-attached metal foil 10 was produced in the same manner as in Example 1 except that only the Ta layer (adhesion layer 14a) was formed as the release functional layer 14, instead of the TaN layer (adhesion layer 14a) and the TaON layer (release layer 14b).

(Formation of Ta layer)

On the carrier 12, a Ta layer having a thickness of 100 nm was formed as the adhesion layer 14a by a sputtering method. The sputtering was performed under the following conditions using the following apparatus.

Apparatus: single wafer type magnetron sputtering apparatus (MLS 464, manufactured by Canon Tokki Corporation)
    Target: Ta target (purity: 99.98%) having a diameter of 8 inches (203.2 mm)
    Ultimate vacuum: less than $1\times10^{-4}$ Pa
    Gas: argon gas (flow rate: 100 sccm)
    Sputtering pressure: 0.35 Pa
    Sputtering power: 1000 W (3.1 W/cm$^2$)
    Temperature during deposition: 40° C.

Example 8 (Comparison)

A carrier-attached metal foil 10 was produced in the same manner as in Example 2 except that a Ta layer was formed as the release layer 14b, instead of the TiON layer.

(Formation of Ta Layer)

A Ta layer having a thickness of 100 nm was formed as the release layer 14b on the adhesion layer 14a by reactive sputtering with the following apparatus and conditions.

Apparatus: single wafer type DC sputtering apparatus (MLS 464, manufactured by Canon Tokki Corporation)
    Target: Ta target (purity: 99.98%) having a diameter of 8 inches (203.2 mm)
    Ultimate vacuum: less than $1\times10^{-4}$ Pa
    Gas: argon gas (flow rate: 100 sccm)
    Sputtering pressure: 0.35 Pa
    Sputtering power: 100 W (0.3 W/cm$^2$)
    Temperature during deposition: 40° C.

Example 9 (Comparison)

A carrier-attached metal foil 10 was produced in the same manner as in Example 1 except that no release layer 14b was formed (that is, the surface oxidization treatment of the adhesion layer 14a was not performed).

Example 10 (Comparison)

A carrier-attached metal foil 10 was produced in the same manner as in Example 2 except that a Ta/TaO$_x$ layer was formed as the release layer 14b, instead of the TiON layer. Specifically, a Ta layer having a thickness of 100 nm was formed on the adhesion layer 14a with the same apparatus and conditions as in Example 8. A sample where the Ta layer was formed was taken out from the vacuum and exposed to the atmosphere for one minute, whereby a surface oxidization treatment (natural oxidization) of the Ta layer was performed. Thus, the Ta/TaO$_x$ layer was formed as the release layer 14b.

Example 11 (Comparison)

As shown in FIG. 3, on a carrier 112, a release functional layer (an adhesion layer 114, a release assistance layer 116, and a carbon layer 118 as a release layer), a second metal layer 120, and a first metal layer 122 were deposited in this order, to produce a carrier-attached metal foil 110. Specific procedures will be described below.

(1) Preparation of Carrier

A glass sheet having a thickness of 1.1 mm (material: soda-lime glass, arithmetic average roughness Ra: 0.6 nm) was prepared.

(2) Formation of Adhesion Layer

On the carrier 112, a Ti layer having a thickness of 100 nm was formed as the adhesion layer 114 by a sputtering method. The sputtering was performed under the following conditions using the following apparatus.

Apparatus: single wafer type magnetron sputtering apparatus (MLS 464, manufactured by Canon Tokki Corporation)
    Target: Ti target (purity: 99.999%) having a diameter of 8 inches (203.2 mm)
    Ultimate vacuum: less than $1\times10^{-4}$ Pa
    Gas: argon gas (flow rate: 100 sccm)
    Sputtering pressure: 0.35 Pa
    Sputtering power: 1000 W (3.1 W/cm$^2$)
    Temperature during deposition: 40° C.

(3) Formation of Release Assistance Layer

A Cu layer having a thickness of 100 nm was formed as the release assistance layer 116 on the adhesion layer 114 by a sputtering method. The sputtering was performed under the following conditions using the following apparatus.

Apparatus: single wafer type magnetron sputtering apparatus (MLS 464, manufactured by Canon Tokki Corporation)
    Target: copper target (purity: 99.98%) having a diameter of 8 inches (203.2 mm)
    Ultimate vacuum: less than $1\times10^{-4}$ Pa
    Gas: argon gas (flow rate: 100 sccm)
    Sputtering pressure: 0.35 Pa
    Sputtering power: 1000 W (6.2 W/cm$^2$)
    Temperature during deposition: 40° C.

(4) Formation of Carbon Layer

An amorphous carbon layer having a thickness of 6 nm was formed as the carbon layer 118 on the release assistance layer by a sputtering method. The sputtering was performed under the following conditions using the following apparatus.

Apparatus: single wafer type magnetron sputtering apparatus (MLS 464, manufactured by Canon Tokki Corporation)
    Target: carbon target (purity: 99.999%) having a diameter of 8 inches (203.2 mm)
    Ultimate vacuum: less than $1\times10^{-4}$ Pa
    Gas: argon gas (flow rate: 100 sccm)
    Sputtering pressure: 0.35 Pa
    Sputtering power: 250 W (0.7 W/cm$^2$)
    Temperature during deposition: 40° C.

(5) Formation of Second Metal Layer

A Ti layer having a thickness of 100 nm was formed as the second metal layer 120 on the carbon layer by sputtering with the following apparatus and conditions.

Apparatus: single wafer type magnetron sputtering apparatus (MLS 464, manufactured by Canon Tokki Corporation)
    Target: Ti target (purity: 99.999%) having a diameter of 8 inches (203.2 mm)
    Gas: argon gas (flow rate: 100 sccm)
    Ultimate vacuum: less than $1\times10^{-4}$ Pa
    Sputtering pressure: 0.35 Pa
    Sputtering power: 1000 W (3.1 W/cm$^2$)

(6) Formation of First Metal Layer

A Cu layer having a thickness of 300 nm was formed as the first metal layer 122 on the second metal layer by a sputtering method. The sputtering was performed under the following conditions using the following apparatus.

Apparatus: single wafer type magnetron sputtering apparatus (MLS 464, manufactured by Canon Tokki Corporation)

Target: Cu target (purity: 99.99%) having a diameter of 8 inches (203.2 mm)
Ultimate vacuum: less than $1\times10^{-4}$ Pa
Gas: argon gas (flow rate: 100 sccm)
Sputtering pressure: 0.35 Pa
Sputtering power: 1000 W (3.1 W/cm$^2$)
Temperature during deposition: 40° C.

Evaluations

The carrier-attached metal foil of each of Examples 1 to 11 was subjected to various evaluations as shown later. The evaluation results were as shown in Tables 1 and 2. Table 2 also showed the compositions of the adhesion layer (including the release assistance layer in Example 11) and the release layer in the release functional layer.

<Evaluation 1: Semi-Quantitative Analysis of Release Layer>

The carrier-attached metal foil 10 produced in Example 1 was subjected to depth direction analysis with X-ray photoelectron spectroscopy (XPS) based on the following measurement conditions and analysis conditions. The analysis was performed while the surface of the release functional layer 14 exposed after release of the metal layer 16 from the carrier-attached metal foil 10 was dug in the depth direction by Ar ion etching in the following conditions.

(Ar Ion Etching Conditions)
Acceleration voltage: 500 V
Etching area: 2 mm×2 mm
Etching rate: 4.4 nm/min in terms of SiO$_2$ (Measurement Conditions)
Apparatus: X-ray photoelectron spectrometer (Versa Probe III manufactured by Ulvac-Phi, Inc.)
Excitation X-ray: monochromatic Al-Kα ray (1486.6 eV)
Output: 50 W
Acceleration voltage: 15 kV
X-ray irradiation diameter: 200 μmφ
Measurement area: 200 μmφ
Pass energy: 26.0 eV
Energy step: 0.1 eV
Neutralizer: adopted
Measurement elements and orbitals: (Number of sweeps: Ratio:Number of cycles)
 C 1s: (3:6:1)
 N 1s: (30:6:1)
 O 1s: (5:6:1)
 Cu 2p3: (2:6:1)
 Ta 4d: (30:6:1)

(Analysis Conditions)

The XPS data was analyzed using data analysis software ("MultiPak Ver 9.4.0.7" manufactured by Ulvac-Phi, Inc.). Smoothing was performed at 15 points, and Shirley was used as a background mode. The range of background of each element in semi-quantitative calculation is as follows.
 C 1s: 280.0 to 292.0 eV
 N 1s (including Ta 4p3): 392.0 to 410.0 eV
 O 1s: 528.0 to 540.0 eV
 Cu 2p3: 927.0 to 939.0 eV
 Ta 4d: 212.0 to 250.0 eV Herein, a N 1s peak interfered with a Ta 4p3 peak, and the semi-quantitative value of N 1s was calculated from the N 1s peak area determined by waveform separation analysis. The energy range of each peak position of N 1s and Ta 4p3 in the waveform separation analysis was as follows. The Gauss function was used as the fitting function in the waveform separation analysis.
 N 1s: 395.9 to 398.2 eV
 Ta 4p3 (metal): 399.5 to 400.5 eV
 Ta 4p3 (oxide): 404.11 to 405.11 eV The results of the semi-quantitative value in the depth direction of the carrier-attached metal foil 10 of Example 1 were as shown in Table 1. As clear from Table 1, it was found that the carrier-attached metal foil 10 of Example 1 had a region present from the surface of the release functional layer 14 (sputtering depth 0 nm) to a depth of 2.9 nm, in which the atomic ratio of O relative to the metal component (that is, Ta) constituting the TaON layer was 4% or more and the atomic ratio of N relative to the metal component constituting the metal oxynitride was 20% or more. Therefore, the TaON layer (release layer 14b) in the carrier-attached metal foil 10 of Example 1 was estimated to have a thickness of about 3 nm in terms of SiO$_2$.

TABLE 1

| Sputtering time [min] | Sputtering depth [nm] | Semi-quantitative value [Atom %] | | | | | O/Ta [%] | N/Ta [%] |
|---|---|---|---|---|---|---|---|---|
| | | C | N | O | Cu | Ta | | |
| 0 | 0 | 19.2 | 10.9 | 35.6 | 2.3 | 32.0 | 111.25 | 34.06 |
| 0.33 | 1.4 | 0 | 25.3 | 14.7 | 1.3 | 58.7 | 25.04 | 43.10 |
| 0.66 | 2.9 | 0 | 28.1 | 4.1 | 0.4 | 66.2 | 6.19 | 42.45 |
| 1 | 4.4 | 0 | 27.1 | 2.5 | 0.2 | 72.8 | 3.43 | 37.23 |
| 1.5 | 6.6 | 0 | 27.2 | 1.7 | 0.2 | 73.6 | 2.31 | 36.96 |
| 2 | 8.7 | 0 | 26.1 | 1.3 | 0 | 74.3 | 1.75 | 35.13 |
| 3 | 13.1 | 0 | 28.1 | 2.5 | 0 | 72.0 | 3.47 | 39.03 |
| 5 | 21.9 | 0 | 27.0 | 1.9 | 0 | 68.8 | 2.76 | 39.24 |
| 10 | 43.7 | 0 | 27.3 | 2.5 | 0 | 71.0 | 3.52 | 38.45 |
| 20 | 87.4 | 0 | 27.0 | 2.2 | 0 | 73.3 | 3.00 | 36.83 |

<Evaluation 2: Releasability of Carrier-Metal Layer>

The release strength of each of carrier-attached metal foils 10 and 110, after vacuum hot pressing as heat history, was measured as follows. First, the metal layer 16 or the first metal layer 122 of the carrier-attached metal foil 10 or 110 was subjected to panel electrodeposited copper plating having a thickness of 18 μm, and pressed at a pressure of 30 kgf/cm$^2$ at 260° C. as heat history for 2 hours. The release strength (gf/cm) of the obtained copper-clad laminate was measured by releasing the electrolytic copper plating layer integrated with the metal layer 16 or the first metal layer 122 in accordance with JIS C 6481-1996. At this time, a measurement width was set to 50 mm and a measurement length was set to 20 mm. The obtained release strength (average value) was rated and evaluated based on the following criteria. The results were as shown in Table 2.
 Evaluation A: release strength of 3 gf/cm or more and less than 30 gf/cm
 Evaluation B: release strength of 30 gf/cm or more and less than 50 gf/cm Evaluation C: release strength of less than 3 gf/cm or 50 gf/cm or more (including an unreleasable case), or unevaluable due to peeling occurring between carrier and release functional layer <Evaluation 3: Number of Foreign Matter Particles>

The number of foreign matter particles on the surface of the metal layer 16 or the first metal layer 122 of the carrier-attached metal foil 10 or 110 was measured as follows. First, the total number of foreign matter particles (particle size 5 μm or more) in a predetermined area on the surface of each of the carrier-attached metal foils was measured using a foreign matter inspection device (HS930 manufactured by Toray Engineering Co., Ltd.). Next, the total number was divided by the measurement area, to calculate the number per unit area (square centimeter) of foreign matter particles. A region until 10 mm from the end of each of the carrier-attached metal foils was out of the measurement range. The number per unit area (5 μm or more) of foreign matter particles, thus obtained, was rated and evaluated based on the following criteria. The results were as shown in Table 2.

Evaluation A: number per square centimeter of foreign matter particles of 5 μm or more, of less than 0.20

Evaluation B: number per square centimeter of foreign matter particles of 5 μm or more, of 0.20 or more and less than 0.50

Evaluation C: number per square centimeter of foreign matter particles of 5 μm or more, of 0.50 or more <Comprehensive Evaluation>

Comprehensive evaluation was determined based on the evaluation results of Evaluations 2 and 3. A case where the evaluation result of Evaluation 2 was Evaluation A or B and the evaluation result of Evaluation 3 was Evaluation A or B was determined as "Pass", and any other case was determined as "Fail". The results were as shown in Table 2.

[Table 2]

TABLE 2

| | Release functional layer | | Evaluations of carrier-attached metal foil | | |
|---|---|---|---|---|---|
| | Adhesion layer | Release layer | Releasability of carrier-metal foil | Number of foreign matter particles | Comprehensive evaluation |
| Ex. 1 | TaN | TaON | A (10 gf/cm) | A (0.14) | Pass |
| Ex. 2 | TaN | TiON | A (20 gf/cm) | B (0.30) | Pass |
| Ex. 3 | Ti | TaON | A (22 gf/cm) | B (0.31) | Pass |
| Ex. 4 | Ti | TiON | A (24 gf/cm) | A (0.15) | Pass |
| Ex. 5 | Al | TaON | A (15 gf/cm) | B (0.28) | Pass |
| Ex. 6 | Al | TiON | A (18 gf/cm) | B (0.29) | Pass |
| Ex. 7* | Ta | None | C | A (0.17) | Fail |
| Ex. 8* | TaN | Ta | C | A (0.16) | Fail |
| Ex. 9* | TaN | None | C | A (0.19) | Fail |
| Ex. 10* | TaN | Ta/TaO$_x$ | C | A (0.17) | Fail |
| Ex. 11* | Ti/Cu | C | A (7 gf/cm) | C (0.56) | Fail |

*represents Comparative Example.

The invention claimed is:

1. A carrier-attached metal foil comprising:
   a carrier;
   a release functional layer provided on the carrier, the release functional layer including a metal oxynitride; and
   a metal layer provided on the release functional layer;
   wherein the release functional layer includes:
   an adhesion layer provided on the carrier, the adhesion layer containing at least one selected from the group consisting of Cu, Ti, Ta, Cr, Ni, Al, Mo, Zn, W, TiN, and TaN, and
   a release layer provided on the adhesion layer, the release layer containing at least one metal oxynitride selected from the group consisting of TaON, NiON, TiON, NiWON, and MoON.

2. The carrier-attached metal foil according to claim 1, wherein the metal oxynitride comprises at least one selected from the group consisting of TaON, NiON, TiON, NiWON, and MOON.

3. The carrier-attached metal foil according to claim 1, wherein the adhesion layer contains 30 atom % or more of at least one selected from the group consisting of Cu, Ti, Ta, Cr, Ni, Al, Mo, Zn, W, TiN, and TaN.

4. The carrier-attached metal foil according to claim 1, wherein the adhesion layer has a thickness $T_1$ of 5 nm or more and 400 nm or less.

5. The carrier-attached metal foil according to claim 1, wherein the release layer is such that an atomic ratio of O relative to a metal component constituting the metal oxynitride is 4% or more and an atomic ratio of N relative to the metal component constituting the metal oxynitride is 20% or more, as measured by X-ray photoelectron spectroscopy (XPS).

6. The carrier-attached metal foil according to claim 1, wherein the release layer has a thickness $T_2$ of 1 nm or more and 150 nm or less.

7. The carrier-attached metal foil according to claim 1, wherein a ratio $T_1/T_2$ of the thickness $T_1$ of the adhesion layer to the thickness $T_2$ of the release layer is 0.03 or more and 400 or less.

8. The carrier-attached metal foil according to claim 1, wherein the carrier is composed of glass, silicon, or a ceramic.

9. The carrier-attached metal foil according to claim 1, wherein the metal layer is composed of at least one metal or alloy selected from the group consisting of Cu, Au, and Pt.

10. The carrier-attached metal foil according to claim 1, wherein the metal layer has a thickness $T_3$ of 10 nm or more and 1000 nm or less.

* * * * *